US 6,661,765 B2

(12) United States Patent
Nakano et al.

(10) Patent No.: US 6,661,765 B2
(45) Date of Patent: Dec. 9, 2003

(54) OPTICAL PICKUP APPARATUS

(75) Inventors: Junichi Nakano, Hachioji (JP);
Nobuyoshi Iwasaki, Hachioji (JP);
Daisuke Matsuo, Kodaira (JP); Shohei Kobayashi, Hachioji (JP)

(73) Assignee: Olympus Optical Co., Ltd., Tokyo (JP)

( * ) Notice: Subject to any disclaimer, the term of this patent is extended or adjusted under 35 U.S.C. 154(b) by 420 days.

(21) Appl. No.: 09/748,940

(22) Filed: Dec. 27, 2000

(65) Prior Publication Data

US 2001/0008538 A1 Jul. 19, 2001

(30) Foreign Application Priority Data

Jan. 19, 2000 (JP) .......................... 2000-010721
Aug. 23, 2000 (JP) .......................... 2000-252564

(51) Int. Cl.[7] ................................ G11B 7/00
(52) U.S. Cl. .................. 369/112.01; 369/112.2; 369/112.19; 369/112.23
(58) Field of Search ................. 309/112.01, 112.2, 309/112.08, 112.16, 112.17, 112.19, 112.23, 112.28, 110.02

(56) References Cited

U.S. PATENT DOCUMENTS 5,579,291 A * 11/1996 Matsumoto ................. 369/110
5,708,644 A * 1/1998 Hasegawa ............... 369/112.01
5,790,504 A * 8/1998 Hayashi et al. ............. 369/110
6,496,465 B1 * 12/2002 Broom et al. ............... 369/110

FOREIGN PATENT DOCUMENTS

JP          10-143934         5/1998

* cited by examiner

Primary Examiner—Nabil Hindi
(74) Attorney, Agent, or Firm—Frishauf, Holtz, Goodman & Chick, P.C.

(57) ABSTRACT

A laser beam emitted from a laser source provided at a silicon substrate passes through a hologram element formed of a translucent flat plate and a grating, thereby being subjected to NA conversion executed by an NA converting lens, passing through a polarizing film of a polarization beam splitter, and converging onto a magneto-optical disk via a collimator lens and an objective. A part of back-reflection from the magneto-optical disk, which is reflected by a polarizing film of the polarization beam splitter, is reflected by a reflection surface of the splitter, then branched into two polarized light beams by a Wollaston prism, and guided to one light receiving element group. On the other hand, another part of the back-reflection, which passes through the polarization beam splitter, is branched into two beams by the hologram element and guided to the other light receiving element groups.

18 Claims, 8 Drawing Sheets

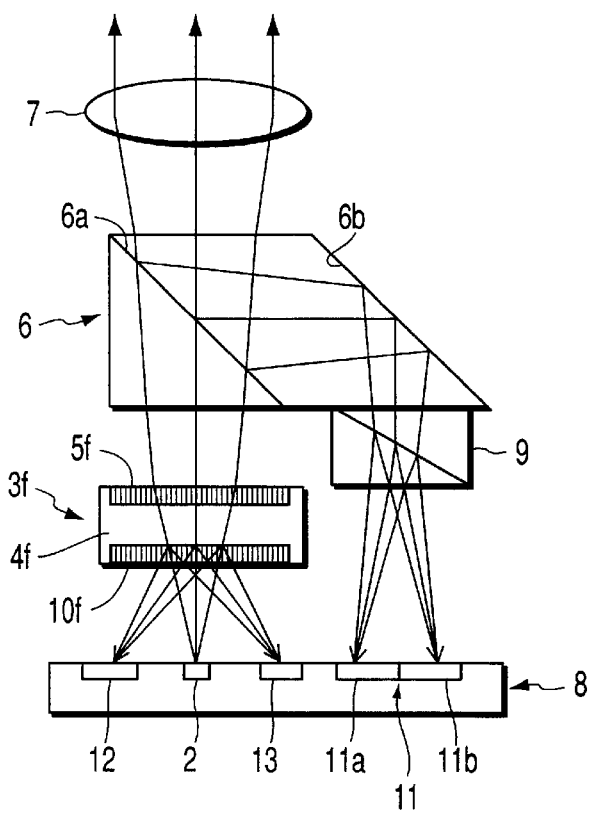
F I G. 10
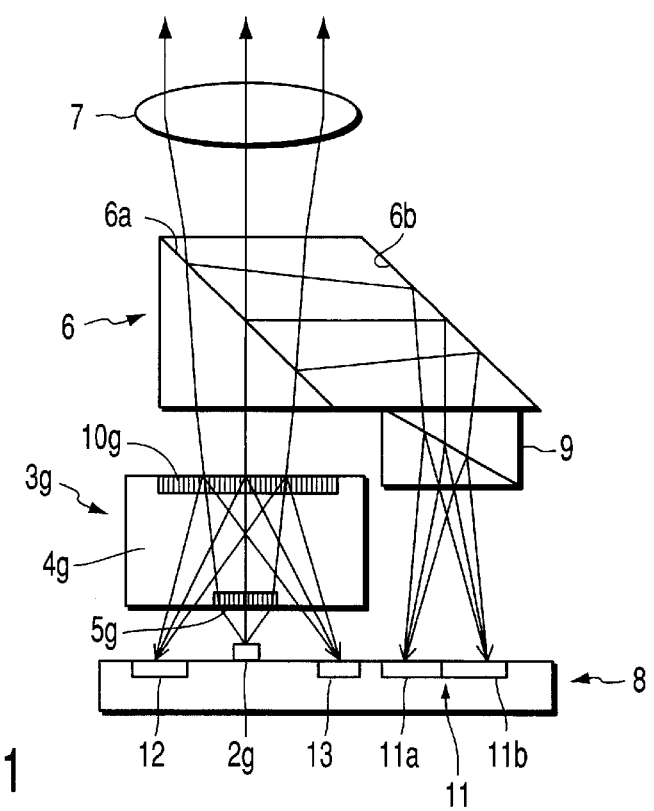
F I G. 11

OPTICAL PICKUP APPARATUS

CROSS-REFERENCE TO RELATED APPLICATIONS

This application is based upon and claims the benefit of priority from the prior Japanese Patent Applications No. 2000-010721, filed Jan. 19, 2000; and No. 2000-252564, filed Aug. 23, 2000, the entire contents of which are incorporated herein by reference.

BACKGROUND OF THE INVENTION

This invention relates to an optical pickup apparatus for executing at least one of data recording and reproduction by applying a laser beam to a data recording medium.

A magneto-optical pickup apparatus is known as an apparatus capable of repeatedly recording and reproducing data. The most important demand for this apparatus is downsizing. To satisfy the demand, various means are being proposed. For example, Japanese Patent Application KOKAI Publication No. 10-143934 discloses an all-in-one type magneto-optical pickup apparatus as shown in FIG. 14.

This optical pickup apparatus comprises a silicon substrate 32, a hologram element 38 provided on the silicon substrate 32, a Wollaston prism 40 and a polarizing prism 39 provided on the hologram element 38. The hologram element 38 has a beam branching function. The Wollaston prism 40 and the polarizing prism 39 are formed integral as one body. The polarizing prism 39 has a polarization beam separating film 39a and an inclined surface 39b. The polarization beam separating film 39a has a transmittance of substantially 70% and a reflectance of substantially 30% for P-polarized light, and has a reflectance of substantially 100% for S-polarized light. The inclined surface 39b reflects light reflected by the polarization beam separating film 39a, thereby branching the light.

In the above-described optical pickup apparatus, a laser diode 33 emits a P-polarized light beam. The laser beam emitted from the laser diode 33 passes through the hologram element 38 and enters the polarizing prism 39. Part of the laser beam entering the prism 39 passes through the polarization beam separating film 39a, and is then converged by an objective 42 onto a magneto-optical disk 43. When the converged laser beam is reflected from the magneto-optical disk 43, the direction of polarization of the laser beam is rotated through substantially about 0.5° by a magnetic signal recorded in the magneto-optical disk 43. As a result, the laser beam reflected from the magneto-optical disk 43 has a small amount of S-polarized light component that serves as a magneto-optical signal. This reflected light again enters the polarizing prism 39 via the objective 42.

Almost all the light having the S-polarized light component, which is contained in the light entering the polarizing prism 39, is reflected from the polarization beam separating film 39a of the prism 39, and then reflected from the inclined surface 39b of the prism 39. The thus-branched light enters the Wollaston prism 40. The light entering the Wollaston prism 40 branches into two polarized light beams. The polarizations of these two beams are perpendicular to each other. These two beams enter respective sections 36a and 36b of a photodiode 36 for data signal detection. Data detection is executed by detecting the difference between two signals output from the sections 36a and 36b.

On the other hand, part of the light, which has the P-polarized light component and enters the polarizing prism 39, passes through the polarization beam separating film 39a and then enters the hologram element 38. At this time, "+" first-order diffracted light and "−" first-order diffracted light are generated. Thus, the light entering the hologram element 38 branches into two light beams. The "+" first-order diffracted light and "−" first-order diffracted light enter photodiodes 34 and 35 for error signal detection, respectively. At this time, the "+" first-order diffracted light is converged in a position between the hologram element 38 and the photodiode 34 by the lens effect of the hologram element 38. On the other hand, the "−" first-order diffracted light is converged in a position beyond the photodiode 35. Using this phenomenon, a focus error is detected by detecting the spot sizes of the light beams on the photodiodes 34 and 35. Further, an error in tracking is detected by detecting the positions of light spots on the photodiodes 34 and 35.

Since, in general, light emitted from a laser is divergent light, the magneto-optical pickup apparatus disclosed in Japanese Patent Application KOKAI Publication No. 10-143934 can use only the central part of a laser beam, and cannot use the peripheral part of the beam. Accordingly, the efficiency of use of light is low. This means that the disclosed apparatus cannot be used as a magneto-optical pickup apparatus that requires a high laser output, such as a rewritable magneto-optical pickup apparatus, or as a magneto-optical pickup apparatus in which the rotational speed of the disk is increased to increase the transfer rate.

Moreover, when using even the peripheral part of a laser beam, the disclosed apparatus requires a large polarizing prism that can receive a wide range of light. This makes it difficult to reduce the size of the apparatus.

In other words, the all-in-one type pickup apparatus disclosed in Japanese Patent Application KOKAI Publication No. 10-143934 can not satisfy the requirements of increasing the efficiency of use of light, that is, increasing the power of the light applied to the data recording medium as well as of downsizing the pickup apparatus.

BRIEF SUMMARY OF THE INVENTION

It is the object of the invention to provide a compact optical pickup apparatus which has higher efficiency of use of light.

To attain the object, according to one aspect of the invention, there is provided an optical pickup apparatus for executing at least one of data recording and reproduction by applying a laser beam to a data recording medium, comprising: a semiconductor substrate having a main surface; a light source for emitting a laser beam in a direction substantially perpendicular to the main surface of the semiconductor substrate; an NA converter for receiving the laser beam emitted from the light source and for outputting the laser beam so that a divergent angle of the outputted laser beam smaller than a divergent angle of the received laser beam; an objective opposed to the data recording medium; a first beam branching unit for permitting one of transmission therethrough and reflection therefrom of the laser beam outputted from the NA converter to thereby guide the laser beam to the data recording medium via the objective so that the laser beam reflects from the data recording medium, the first beam branching unit also transmits therethrough and reflects therefrom a part of and another part of the laser beam reflecting from the data recording medium and then passing through the objective, respectively, thereby branching the laser beam in two directions; and a first light receiving element provided at the semiconductor substrate, for receiving the laser beam branched by the first beam branching unit.

According to the other aspect of the invention, there is provided an optical pickup apparatus for executing at least one of data recording and reproduction by applying a laser beam to a data recording medium, comprising: a semiconductor substrate having a main surface; a light source for emitting a laser beam in a direction substantially perpendicular to the main surface of the semiconductor substrate; a means for receiving the laser beam emitted from the light source, converting the received laser beam and for outputting the laser beam so that a divergent angle of the outputted laser beam smaller than a divergent angle of the received laser beam; an objective opposed to the data recording medium; a means for permitting one of transmission therethrough and reflection therefrom of the laser beam outputted from the divergent angle converting means to thereby guide the laser beam to the data recording medium via the objective so that the laser beam reflects from the data recording medium, and for transmitting therethrough and reflecting therefrom a part of and another part of the laser beam reflecting from the data recording medium and then passing through the objective, respectively, thereby branching the laser beam in two directions; and a means provided at the semiconductor substrate, for receiving the laser beam branched by the beam branching means.

The NA converter or the divergent angle converting means can pick up even a peripheral portion of a laser beam emitted from the light source. This enhances the efficiency of use of light. Further, since the NA converter or the divergent angle converting means reduces the divergent angle and the diameter of the laser beam emitted from the light source, a large optical component is not necessary even when picking up a peripheral portion of the laser beam emitted from the light source. Accordingly, a compact optical pickup apparatus can be produced.

Preferably, the NA converter has a numerical aperture of 0.15 or more at a side thereof close to the light source.

This NA converter can pick up a laser beam with a relatively large divergent angle emitted from the light source. Accordingly, the laser beam emitted from the light source can be used efficiently.

More preferably, the first beam branching unit transmits therethrough the laser beam outputted from the NA converter to thereby guide the laser beam to the data recording medium via the objective.

Between transmitted light and reflected light, the first beam branching unit shows different variations in skipping depending for incident angle. Specifically, in the first beam branching unit, the aberration of transmitted light is smaller than that of reflected light, and hence the spot size of the light transmitting the first beam branching unit and converged by the objective can be reduced to a value close to the diffraction limit. As a result, the spot size of the laser beam on the data recording medium can be reduced to substantially the same value as obtained in the case of no aberration. This enables accurate and high-density recording and/or reproduction of data.

Also preferably, the optical pickup apparatus further comprises a second beam branching unit provided between the light source and the first beam branching unit, for transmitting therethrough, in one direction, a part of the laser beam reflecting from the data recording medium and passing through the objective, and branching therefrom, in another direction, another part of the laser beam reflecting from the data recording medium and passing through the objective; and a second light receiving element for receiving the laser beam branched by the second beam branching unit.

The second beam branching unit and the second light receiving element constitute an error signal detection system, which enables the production of a more compact and high-density optical pickup apparatus.

Yet preferably, the second beam branching unit is provided between the light source and the NA converter.

Since no optical component is provided between the second beam branching unit and the light source, the optical positions of the light source and the second light receiving element are secured with high accuracy. Accordingly, the data recording medium and the second light receiving element can be easily made to have substantially a conjugate positional relationship. This being so, error detection such as detection of the size or the position of a light spot on the second light receiving element can be executed reliably at all times.

Further preferably, the NA converter is provided between the second beam branching unit and the light source.

Since the distance between the NA converter and the light source can be reduced, a laser beam emitted from the light source enters the NA converter before it diverges. Accordingly, the beam diameter of the laser beam passing through the NA converter is reduced, which means that the optical pickup apparatus can be made more compact.

Preferably, the NA converter is provided between the second beam branching unit and the second light receiving element, so that the laser beam branched by the second beam branching unit passes through the NA converter and reaches the second light receiving element.

Since both the beam branched by the second beam branching unit and reaching the second light receiving element, and the beam emitted from light source and reaching the second beam branching unit pass through the NA converter, it is easy to adjust the optical distance of the former light and the optical distance of the latter simultaneously. As a result, the data recording medium and the second light receiving element can be easily made to have substantially a conjugate positional relationship. This being so, error detection such as detection of the size or the position of a light spot on the second light receiving element can be executed reliably at all times.

Preferably, the NA converter is provided between the second beam branching unit and the second light receiving element, so that the laser beam branched by the second beam branching unit reaches the second light receiving element without passing through the NA converter.

Light branched by the second beam branching unit and reaching the second light receiving element does not pass through the NA converter, while light emitted from the light source and reaching the second beam branching unit passes through the NA converter. Accordingly, the distance between the light source and the second beam branching unit can be made shorter than the distance between the second light receiving element and the second beam branching unit. This increases the number of manners that can be used to mount the semiconductor laser.

Preferably, the second light receiving element is provided at the semiconductor substrate.

Since the first and second light receiving elements are formed in surface portions of a single semiconductor substrate, the number of their component parts is reduced, and hence the cost of the light receiving elements can be reduced.

Further preferably, the second beam branching unit includes a hologram element.

Since the angle between light beams branched by the hologram element is smaller than the angle between light beams branched using reflection of, for example, a prism, the optical pickup apparatus can be made more compact.

Yet preferably, at least, the semiconductor substrate, the light source, the first beam branching unit, the second beam branching unit and the NA converter are integrated as one body.

Since these component parts are formed integral as one body, the optical pickup apparatus can be made more compact.

Also preferably, the NA converter is integral with at least one of the first beam branching unit and the second beam branching unit.

Forming the NA converter integral with an optical branching element enables reduction of the number of the component parts of the optical pickup apparatus, and hence reduction of its cost.

It is desirable that the optical pickup apparatus further comprises a collimator lens provided between the first beam branching unit and the objective, so that the collimator lens converts the laser beam outputted from first beam branching unit into substantially a parallel laser beam.

Since this optical system is an infinite optical system in which parallel light is created using the collimator lens and converged using the objective, there is no change in the output power of the objective even when the objective is shifted along the optical axis for the purpose of focusing control. Therefore, high output power can be obtained reliably. Moreover, since in this optical system, a separating optical system, in which only the objective is incorporated in a movable section, can be achieved, power saving or high-speed operation can be realized.

Preferably, the collimator lens corrects spherical aberration that occurs in the NA converter, the first beam branching unit and the second beam branching unit.

Correction of aberration using the collimator lens enables reduction of the spot size of light converged on the data recording medium by the objective to a value close to the diffraction limit objective. As a result, high-density recording and/or reproduction and increase of the capacity of a single sheet of data recoding medium can be realized.

It is also preferable that the optical pickup apparatus further comprises a polarization beam separating unit for separating, into a plurality of polarized laser beams, the laser beam reflecting from the data recording medium, passing through the objective and branched by the first beam branching unit, the polarized laser beams being received by the first light receiving element.

Since the polarization beam separating unit and the first light receiving element can constitute a system for detecting a magneto-optical signal, a more compact optical pickup apparatus of a higher density can be made.

Preferably, the polarized laser beams are focused on a surface of the first light receiving element.

Since the beams are focused on the first light receiving element, the area of this element can be reduced. As a result, the frequency bandwidth of the first light receiving element can be widened, and hence the optical pickup apparatus can be operated at high speed. It is possible that there are advantages similar to that occurs when the beams are focused on the first light receiving element.

Further, the first beam branching unit may be formed of a polarization beam splitter having a transmittance and a reflectance that vary in accordance with a polarization of light entering the polarization beam splitter.

Since the polarization beam splitter enables efficient transmission/reflection of light using polarization characteristics, the efficiency of use of light and the quality of a signal can be enhanced.

Furthermore, the NA converter may be formed of a convex lens having two opposite surfaces, one of the two opposite surfaces including a convex surface, and the other including a flat surface.

Forming only one surface of the NA converting lens as a convex surface can reduce the cost of the lens. Moreover, since the other surface of the lens is a flat surface, mounting of the lens in the apparatus or attachment of the lens to an optical element for branching light can be executed easily.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a schematic view illustrating part of an optical pickup apparatus according to a seventh embodiment of the invention;

FIG. 11 is a schematic view illustrating part of an optical pickup apparatus according to an eighth embodiment of the invention;

DETAILED DESCRIPTION OF THE INVENTION

Figure 1:
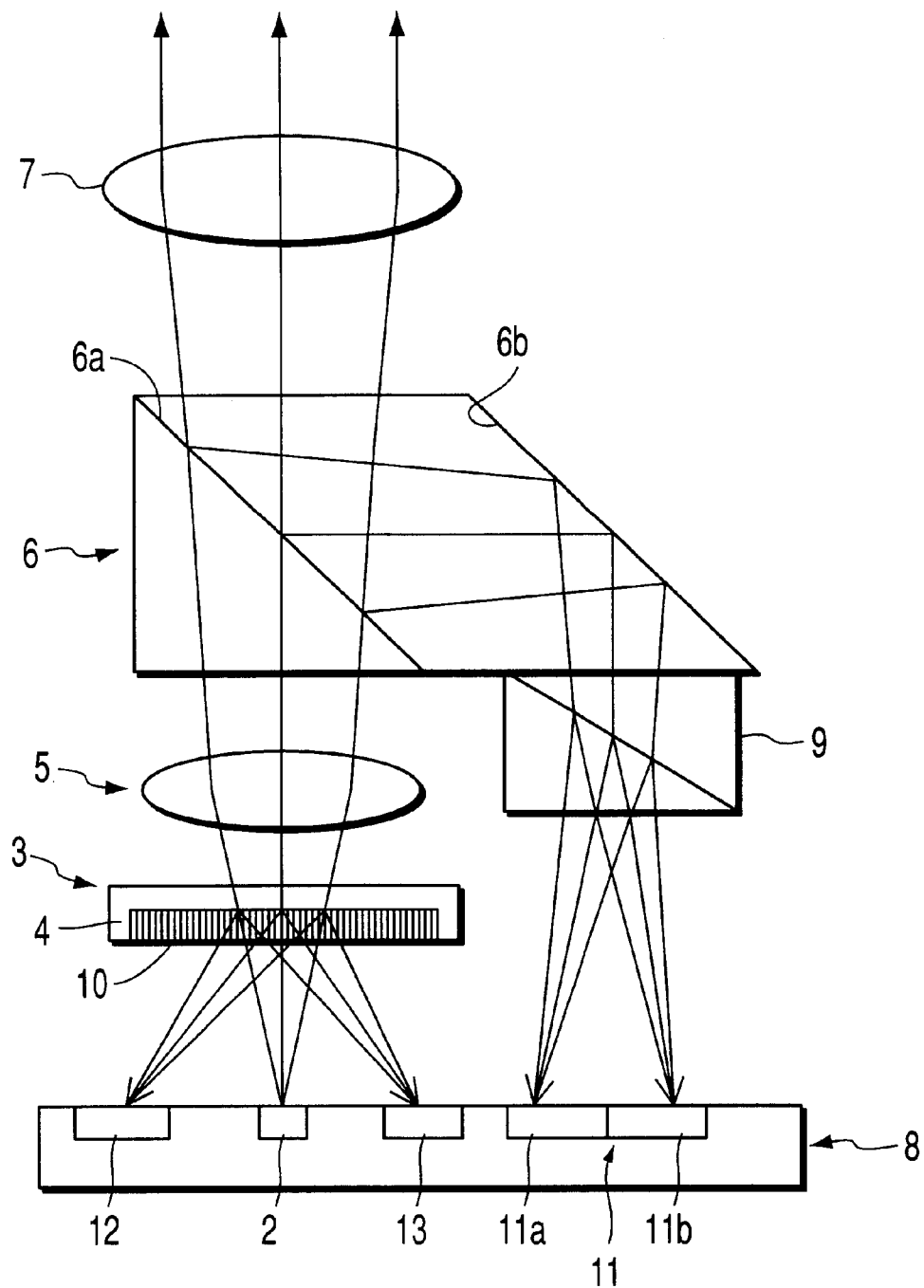
FIG. 1 is a schematic view illustrating part of an optical pickup apparatus according to a first embodiment of the invention.

The embodiments of the invention will be described in detail with reference to the accompanying drawings. FIG. 1 is a schematic view illustrating part of an optical pickup apparatus according to a first embodiment of the invention. A silicon substrate 8 as a semiconductor substrate has a laser source 2 as a light source, light receiving element groups 12 and 13 as a second light receiving element, and a light receiving element group 11 as a first light receiving element. The laser source 2 is provided by, for example, forming, using e.g. etching, a recess having a surface inclined by substantially 45° in a surface portion of the silicon substrate 8, and placing therein a semiconductor laser chip. Light emitted from the semiconductor laser chip is reflected upward from the 45°-inclined surface. The laser source 2 can emit a linearly polarized laser beam in a direction substantially perpendicular to the surface of the silicon substrate 8. A light source of this type is disclosed in, for example, Japanese Patent Application KOKAI Publication No. 4-196189. The light receiving element groups 12 and 13 each include a plurality of light receiving elements and are used to detect an error signal. The light receiving element group 11 includes light receiving elements 11a and 11b and is used to detect a magneto-optical data signal.

A hologram element 3 is provided above the silicon substrate 8, i.e. in a direction in which the laser source 2 emits a laser beam. The hologram element 3 has a light-transmitting flat plate 4, and a grating 10 provided on the lower surface of the plate 4.

An NA converting lens 5 used as an NA converter is provided above the hologram element 3 along the optical axis of the apparatus. The NA converting lens 5 has a function of changing the divergent angle of a laser beam outputted therefrom. As a result, the divergent angle of the laser beam entering the NA converting lens 5 and the divergent angle of the laser beam outputted therefrom differ from each other. In the first embodiment, the NA converting lens 5 is, for example, a convex lens.

A first beam branching unit is provided above the NA converting lens 5 along the optical axis of the apparatus. It is desirable that the first beam branching unit should be formed of a polarization beam splitter 6 that has its transmittance and reflectance varied in accordance with the polarized state of incident light. The polarization beam splitter 6 is formed by optically attaching an optical glass member having a substantially triangular cross section to an optical glass member having a substantially parallelogrammatic cross section. The polarization beam splitter 6 includes a polarizing film 6a that is provided in the attachment surface and has its transmittance and reflectance varied in accordance with the polarized state of incident light. The splitter 6 also includes a reflection surface 6b, which is included in the surfaces of the optical glass member having the substantially parallelogrammatic cross section, and is opposed to the attachment surface. The polarizing film 6a and the reflection surface 6b are substantially parallel to each other.

A collimator lens 7 is provided above the polarization beam splitter 6 for collimating light guided thereto from the splitter 6.

A Wollaston prism 9 used as a polarization beam separating unit is provided on the lower surface of the polarization beam splitter 6 along the optical axis of the apparatus, along which light reflected from the polarizing film 6a of the beam splitter 6 is reflected from the reflection surface 6b and hence deflected to the silicon substrate 8. The Wollaston prism 9 separates received light. In other words, the Wollaston prism 9 separates a single light beam two polarized light beams. The polarization of two separated beams are perpendicular to each other.

A laser beam emitted from the laser source 2 passes through the hologram element 3 and reaches the NA converting lens 5, where it is subjected to NA conversion. As a result of the NA conversion, the divergent angle of the laser beam passing through the NA converting lens 5 is smaller than its input divergent angle. The resultant laser beam partially passes through the polarization beam splitter 6, enters the collimator lens 7, where it is converted into a parallel beam. This parallel beam is converged onto a data recording medium by an objective, described later. Thus, the polarization beam splitter 6 transmits therethrough the laser beam outputted from the NA converting lens 5 to thereby guide the objective. The laser beam converged on the data recording medium has a linear polarization as aforementioned. After the laser beam reflects from the data recording medium, it has a component of the polarization perpendicular to the linear polarization.

Back-reflection from the data recording medium, which contains magneto-optical data, again passes through the objective and the collimator lens 7 and enters the polarization beam splitter 6.

Part of the back-reflection entering the polarization beam splitter 6 and containing the magneto-optical record data reflects from the polarizing film 6a of the splitter 6 and branches. This reflection further reflects from the reflection surface 6b, thereby deflects toward the silicon substrate 8 and enters the Wollaston prism 9.

The Wollaston prism 9 separates the incident light beam into two polarized beams. Specifically, the light entering the Wollaston prism 9 branches into the light beam having the component of the polarization directed at an angle of about "+" 45° to the polarization of the laser beam prior to reflection at the data recording medium, and the light beam having the component of the polarization directed at an angle of about "−" 45°. These two light beams enter the respective light receiving elements 11a and 11b of the light receiving element group 11 of the silicon substrate 8.

Magneto-optical record data is detected by detecting the difference between signals corresponding to the two light beams received by the light receiving elements 11a and 11b. The materials, sizes and arrangement of the optical components of the apparatus are set so that the two light beams can be substantially converged on the respective light receiving elements of the light receiving element group 11.

The part of the back-reflection from the data recording medium, which passes through the polarization beam splitter 6, is again subjected to NA conversion executed by the NA converting lens 5, and then enters the grating 10 of the hologram element 3 that is used as a second beam branching unit. At this time, "+" first-order diffracted light and "−" first-order diffracted light are generated. Thus, the light entering the hologram element 3 branches into two light beams. These two beams enter the respective light receiving element groups 12 and 13 for error detection. As a result, error detection is executed as in Japanese Patent Application KOKAI Publication No. 10-143934.

The collimator lens 7 corrects spherical aberration that occurs in the NA converting lens 5, the polarization beam splitter 6 and the grating 10. The correction of aberration by the collimator lens enables reduction, to the limit of diffraction, of the spot diameter of light converged by the objective onto the data recording medium. This realizes high density recording and/or reproduction and an increase in the capacity of one data recording disk.

(Advantages)

The NA converting lens 5 is formed of, for example, a convex lens, and used to reduce the wide angle diversion of light emitted from the laser source 2. This enables the use of that laser beam component as the peripheral part of a laser beam of a wide angle diversion emitted form the laser source 1, which cannot be used in a conventional apparatus that employs no NA converter. Accordingly, the efficiency of use of a laser beam is enhanced, and hence the intensity of a laser beam converged on the data recording medium, i.e. the intensity of a laser beam from the optical pickup apparatus, can be increased. By virtue of this structure, the semiconductor laser of the invention can be driven by a lower power than the conventional laser, thereby elongating the life of the laser. Further, since this embodiment can apply a stronger laser beam to the data recording medium, it can be used for a rewritable disk that requires a high power. In addition, since the embodiment can supply power necessary for recording and/or reproduction of data even when the data recording medium is rotated at high speed, high-speed recording and/or reproduction can be realized.

The conventional optical pickup apparatus that does not use any NA converter uses light with an NA of 0.1 or less, about 0.12 at maximum, which is included in a laser beam emitted from a light source. On the other hand, the present invention can use light with an NA of at least 0.15 or more. Preferably, the invention uses light with an NA of 0.2–0.25. When using this NA, the output of the laser source 2 can be effectively used. Converting the high NA of the laser beam into 0.2 or less, more preferably about 0.1–0.15, enables the use of a polarization beam splitter 6 having the same size or smaller than that in the conventional case. Accordingly, the optical pickup apparatus can be made smaller, and further the output of light emitted from the optical pickup apparatus can be increased.

Figure 2:
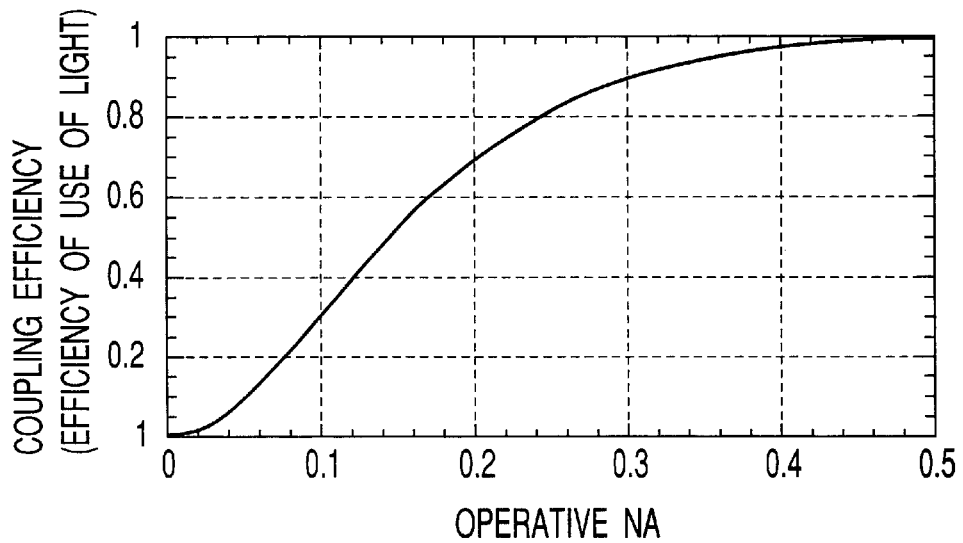
FIG. 2 is a graph illustrating an example of a coupling efficiency (the efficiency of use of light) with respect to operative NA.

FIG. 2 shows an example of a coupling efficiency (the efficiency of use of light) (i.e. the ratio of the amount of used light to the amount of a laser beam emitted from the light source) with respect to operative NA (NA of used light included in the laser beam emitted from the light source). When the operative NA is 0.1 as in the conventional optical pickup apparatus that employs no NA converter, only about 30% of a laser beam emitted from the light source is used. On the other hand, when the operative NA is 0.15 as in the first embodiment, about 50% of the laser beam emitted from the light source can be used, whereby energy sufficient for the optical pickup apparatus for data recording and/or reproducing can be secured. Further, when the operative NA is 0.25, about 80% of the laser beam emitted from the light source can be used at maximum.

Figure 3:
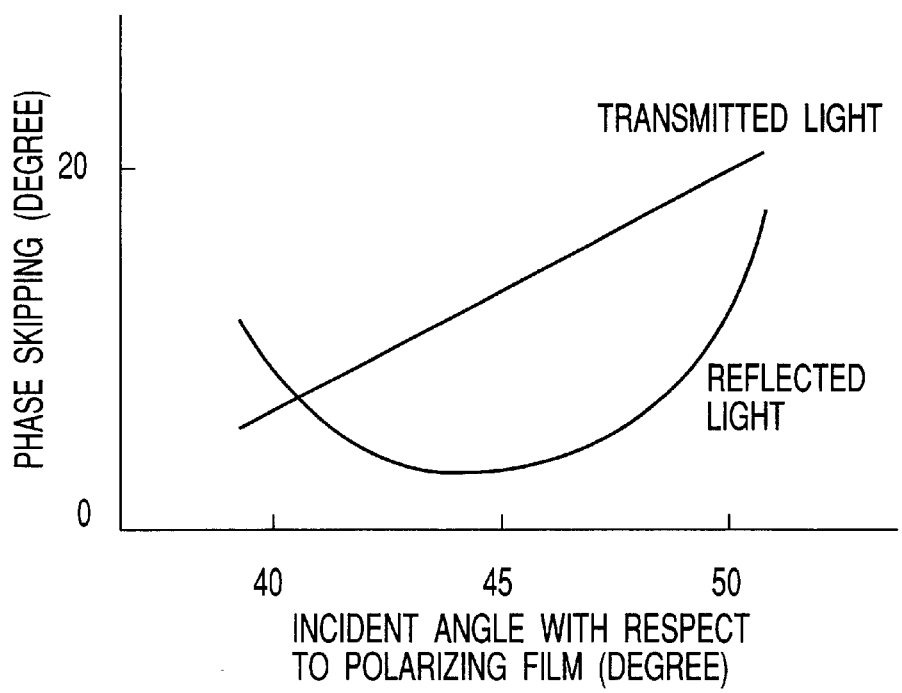
FIG. 3 is a graph illustrating a relationship between phase skipping and incident angle of each of beams passing through and reflecting from a polarization beam splitter.

When a beam passes through or reflects from the polarizing film 6a of the polarization beam splitter 6, phase skipping occurs in the beam. Phase skipping varies for incident angle of a beam, and variation in phase skipping of transmitted light differ from that of reflected light. FIG. 3 shows a relationship between phase skipping and incident angle of each of beams passing through and reflecting from a polarization beam splitter. Phase skipping of transmitted light varies linearly. In other words, phase skipping is proportional to incident angle of light. On the other hand, phase skipping of reflected light varies nonlinearly, i.e. phase skipping is not proportional to incident angle.

Since the beam entering the polarization beam splitter 6 is diffusing light, it has distribution of incident angle for a position in which the beam enters the slitter 6. The typical incident angle range is from about 40° to about 50°. On the basis of incident angle distribution with respect to incident position and variation in phase skipping for incident angle of light, distribution of phase skipping with respect to incident position is determined.

When a beam is converged onto the data recording medium by the objective 7 via the polarization beam splitter 6, the spot of light moves on the data recording medium in a direction perpendicular to the optical axis in accordance with linear variation in phase skipping, as compared with a case where no phase skipping occurs. At this time, the size of the spot does not change. The size of the spot is substantially the same as in the case where no aberration occurs, and relatively small. On the other hand, when a reflected beam is converged on the data recording medium, astigmatism occurs in accordance with non-linear variation in phase skipping, and the size of the spot becomes larger than in the case of no aberration. Accordingly, recording and/or reproduction of data can be executed accurately, and further high-density recording and/or reproduction can be executed.

Referring again to FIG. 1, a description will be given of problems that occur when a laser beam is subjected to NA conversion executed by the NA converting lens 5 and is then made to be parallel light, where the lens 5 is located near the laser source 2.

First, if light entering the NA converting lens 5 is converted into parallel light, i.e. collimated, the beam diameter of the light becomes very small, and hence the WD (work distance) of the objective for converging the beam onto the data recording medium cannot sufficiently be secured, or the NA of the objective cannot sufficiently be secured.

Second, since light containing the data signal and guided to the light receiving element group 11 is parallel light, the spot of light on the silicon substrate 8 becomes large, and two polarized light beams separated into in the Wollaston prism 9 beams overlap with each other, whereby the data signal cannot be detected. If, to avoid this problem, a special optical element dedicated to light convergence is employed, more specifically, if a lens is provided between the Wollaston prism 9 and the silicon substrate 8, the number of component parts of the apparatus increases and therefore the apparatus inevitably becomes more expensive.

Even when the NA of light subjected to NA conversion executed by the NA converting lens 5 is not 0, but very close to 0, it is possible that a problem similar to that occurs when the NA is 0 will occur. On the other hand, when the NA of the light is converted by little variation, the beam diameter of light passing through the polarization beam splitter 6 becomes large. Accordingly, a large beam splitter must be used, thereby increasing the size of the optical pickup apparatus. The variation of NA converting by the NA converting lens 5 is determined in light of both the problems that occur in the case where the NA is 0 and in the case where the NA is converted by little variation, and also in light of, for example, the difficulty of designing an optical system including an NA converter, i.e. in light of the amount of aberration.

In the first embodiment, a laser beam from the data recording medium is branched into two beams using the hologram element 3 as the second beam branching unit, and guided to the light receiving element groups 12 and 13 for error signal detection. Since the laser source 2 and the light receiving element groups 12 and 13 have a conjugate positional relationship, the laser beams are substantially focused on the light receiving element groups 12 and 13. Constructing the optical system like this enables the light receiving element groups 12 and 13 to be formed integral with and located close to the laser source 2 on the silicon substrate 8. As a result, the apparatus can be made compact.

Further, the conjugated relationship between the position of a light convergence spot on the data recording medium and the positions of the light receiving element groups 12 and 13 enables the image of the light convergence spot on the data recording medium to be converged on the light receiving element groups 12 and 13. Accordingly, both focus error detection in which the sizes of light spots on the light receiving element groups 12 and 13 are detected, and tracking error detection in which the positions of the spots on the light receiving element groups 12 and 13 can be executed accurately and reliably.

Moreover, since no optical elements exist between the hologram element 3 and the light receiving element groups 12 and 13, the positions of the hologram element 3 and the light receiving element groups 12 and 13 can be adjusted easily. As a result, the apparatus can be highly reliable even after the position adjustment.

Since the light beam reflected by the polarization beam splitter 6 does not pass through the NA converting lens 5, the optical length of light reflecting from the polarization beam splitter 6, passing through the Wollaston prism 9 and converging is longer than that of light emitted from the laser source 2, passing through the NA converting lens 5 and reaching the polarization beam splitter 6. In other words, the light receiving element group 11 and the laser source 2 have substantially a conjugate positional relationship, and hence light beams separated by the Wollaston prism 9 are focused in positions close to the surface of the light receiving element group 11 for magneto-optical signal detection. Therefore, the area of each light receiving element included in the light receiving element group 11 can be reduced, thereby enhancing the frequency characteristic of each light receiving element.

Figure 4:
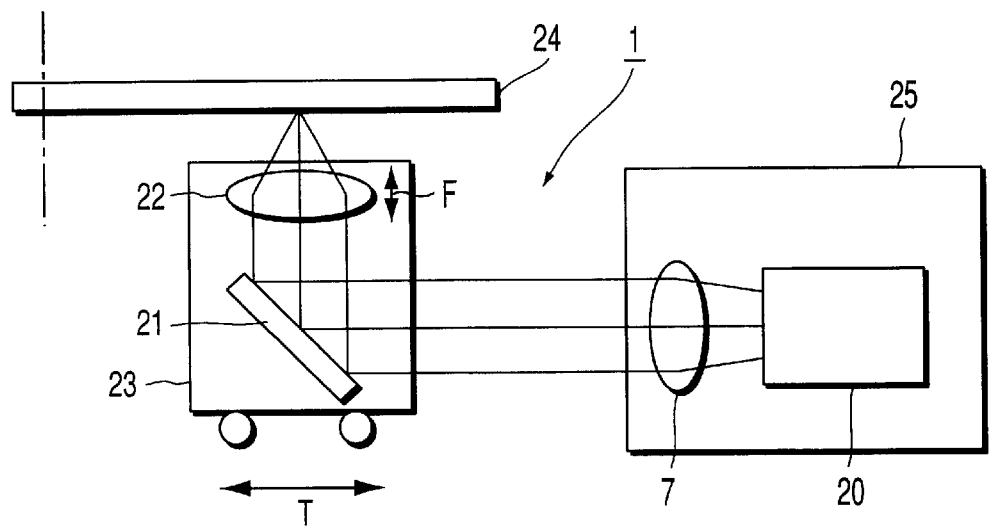
FIG. 4 is a schematic view illustrating the entire structure of the optical pickup apparatus according to the first embodiment of the invention.

FIG. 4 shows an optical pickup apparatus 1. A housing 25 contains the optical component parts, shown in FIG. 1, as fixed optical elements. Among these optical component parts, the silicon substrate 8 including the light source 2 and the light receiving element groups 11, 12 and 13, the hologram element 3, the NA converting lens 5, the polarization beam splitter 6 and the Wollaston prism 9 are contained in a section 20. Among the optical components contained in the section 20, at least, the silicon substrate 8, the hologram element 3, the NA converting lens 5 and the polarization beam splitter 6 are integrated as one body. A housing 23 located near the housing 25 in a direction of light emission houses a mirror 21 for reflecting light entering the housing 23 toward a magneto-optical disk 24 as a data recording medium, and an objective 22 formed integral with the mirror 21 for converging the reflected light onto the magneto-optical disk 24. The housing 23 can be shifted to the direction of arrow T for, for example, access control. The objective 22 can be shifted to the direction of arrow F for focusing control and T for tracking control.

A laser beam emitted from the section 20 in the housing 25 is collimated by the collimator lens 7 into a parallel beam, which is propagated without diverging and enters the housing 23. The beam entering the housing 23 reflects from the mirror 21 and enters the objective 22 without diverging, and converges onto the magneto-optical disk 24. A laser beam reflected from the disk 24 is guided to the section 20 along the path opposite to the above.

Since the above-described structure is an infinite optical system in which light is once collimated by the collimator lens and then converged by the objective, variations in the output power of the objective are eliminated even by shifting the lens along the optical axis for the purpose of focusing control. Accordingly, high emission power can be obtained reliably. Furthermore, since a separating optical system can be realized in which only the objective is provided in a movable section as shown in FIG. 4, power saving or high-speed operation can be realized.

Referring now to FIGS. 5–12, second–eighth embodiments and modifications of the first embodiment will be described. In these modifications and embodiments, similar elements to those employed in the first embodiment are denoted by corresponding reference numerals, and no detailed description will be given of them.

Figure 5:
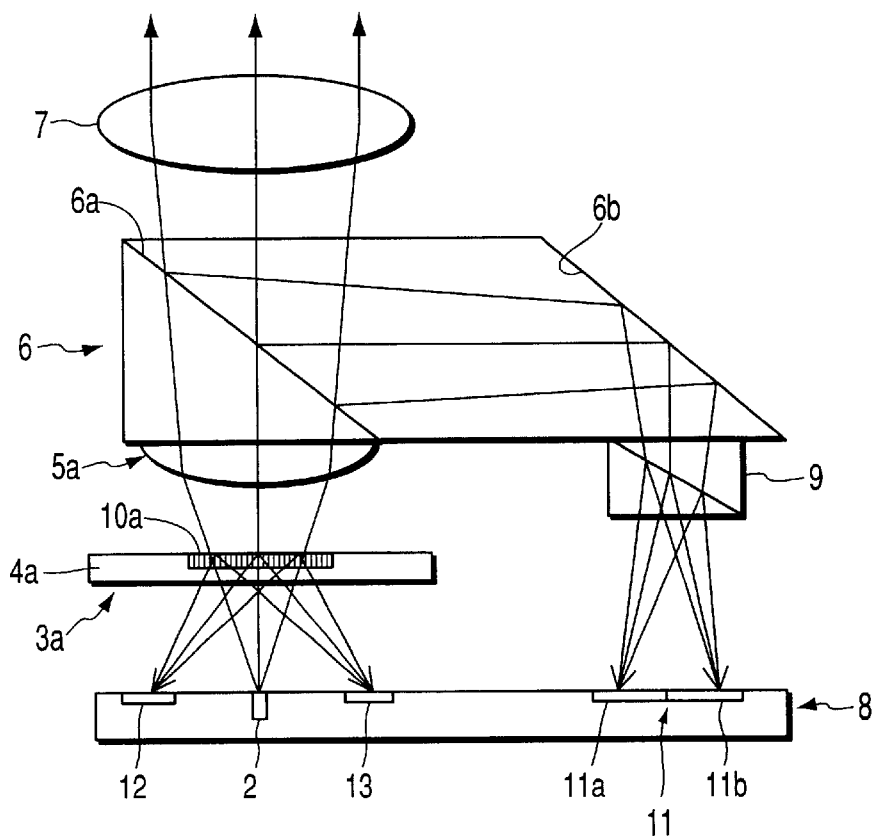
FIG. 5 is a schematic view illustrating part of an optical pickup apparatus according to a second embodiment of the invention.

FIG. 5 is a schematic view illustrating part of an optical pickup apparatus according to a second embodiment of the invention. The second embodiment differs from the first embodiment in that, in the former, an NA converting lens 5a as the NA converter is a convex lens having two opposite surfaces—a convex surface and a flat surface (hereinafter referred to as a "plane-convex lens"), and is formed integral with the polarization beam splitter 6. In the first embodiment, the grating 10 is located below the translucent flat plate 4, while, in the second embodiment, a hologram element 3a includes a translucent flat plate 4a, and a grating 10a provided in an upper portion of the plate 4a.

(Advantages)

Since the NA converting lens 5a is formed of a plane-convex lens, it can be attached to the polarization beam splitter 6, which means that it is not necessary to prepare, for example, any particular mirror frame for supporting the NA converting lens 5a. Thus, the invention does not require adjustment of the NA converting lens 5a in the direction of the optical axis, or provision of such a mirror frame. This being so, the number of component parts can be reduced and hence the entire optical pickup apparatus can be made more compact.

Figure 6:
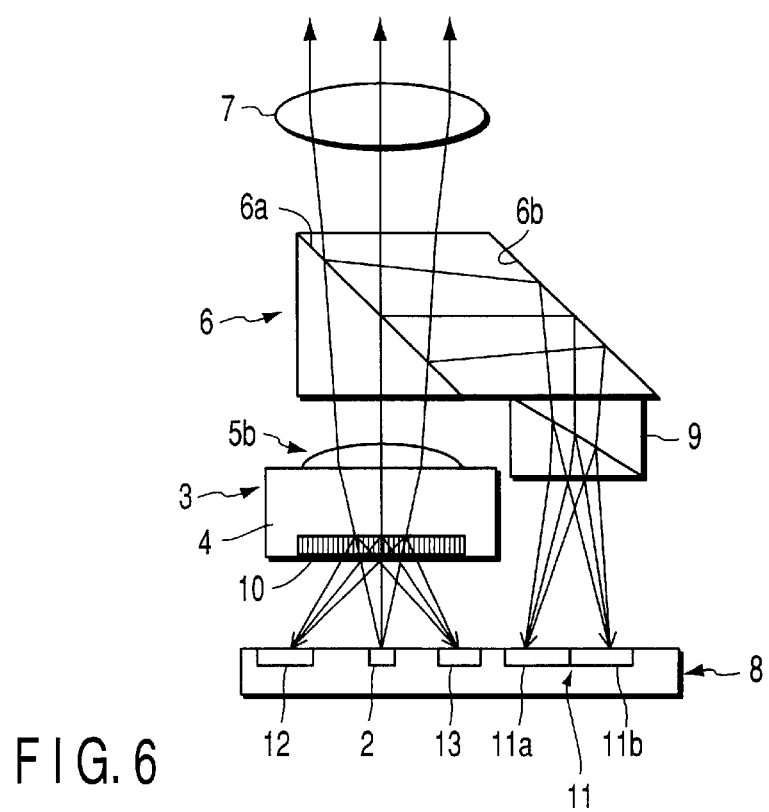
FIG. 6 is a schematic view illustrating part of an optical pickup apparatus according to a third embodiment of the invention.

FIG. 6 is a schematic view illustrating part of an optical pickup apparatus according to a third embodiment of the invention. The third embodiment differs from the first embodiment in that, in the former, an NA converting lens 5b as the NA converter is a plane-convex lens and is formed integral with the hologram element 3. (Advantages)

Since the NA converting lens 5b is formed of a plane-convex lens, it can be attached to the hologram element 3, which means that it is not necessary to prepare, for example, any particular mirror frame for supporting the NA converting lens 5b. Thus, the invention does not require adjustment of the NA converting lens 5b in the direction of the optical axis, or provision of such a mirror frame. This being so, the number of component parts can be reduced and hence the entire optical pickup apparatus can be made more compact.

Figure 7:
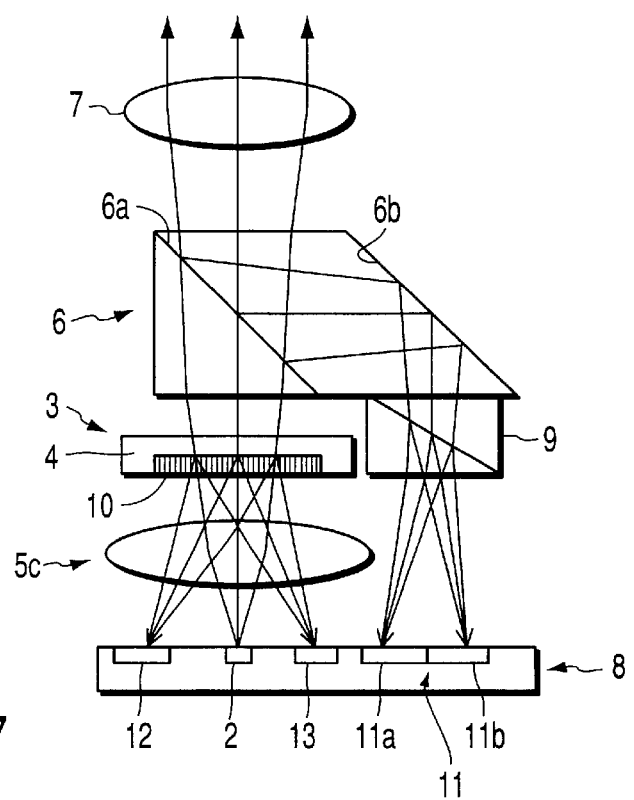
FIG. 7 is a schematic view illustrating part of an optical pickup apparatus according to a fourth embodiment of the invention.

FIG. 7 is a schematic view illustrating part of an optical pickup apparatus according to a fourth embodiment of the invention. The fourth embodiment differs from the first embodiment in that, in the former, an NA converting lens 5c as the NA converter is interposed between the laser source 2 and the hologram element 3. A laser beam emitted from the laser source 2 passes through the hologram element 3 after it is subjected to NA conversion executed by the NA converting lens 5c. Then, the laser beam is partially guided to the magneto-optical disk 24, and part of the laser beam guided to the disk is returned as back-reflection. This back-reflection is branched by the hologram element 3, again subjected to NA conversion executed by the NA converting lens 5c, and directed to the light receiving element groups 12 and 13.

(Advantages)

Since the NA converting lens 5c is interposed between the laser source 2 and the hologram element 3, the distance between the laser source 2 and the NA converting lens 5c is short. Accordingly, the laser beam emitted from the laser source 2 enters the NA converter before it diverges. As a result, the divergent angle of the laser beam output from the NA converter is small, and hence the pickup apparatus can be made more compact. Further, since both the laser beams branched by the hologram element 3 and reaching the light receiving element groups 12 and 13, and the laser beam emitted from the laser source 2 and reaching the hologram element 3 pass through the NA converting lens 5c, it is easy to control the optical distances of the laser beams. As a result, the magneto-optical disk 24 and the light receiving element groups 12 and 13 can be made to have a conjugate positional relationship, which enables reliable detection of an error in which the size or the position of a light spot on the light receiving element groups 12 and 13 are detected.

Figure 8:
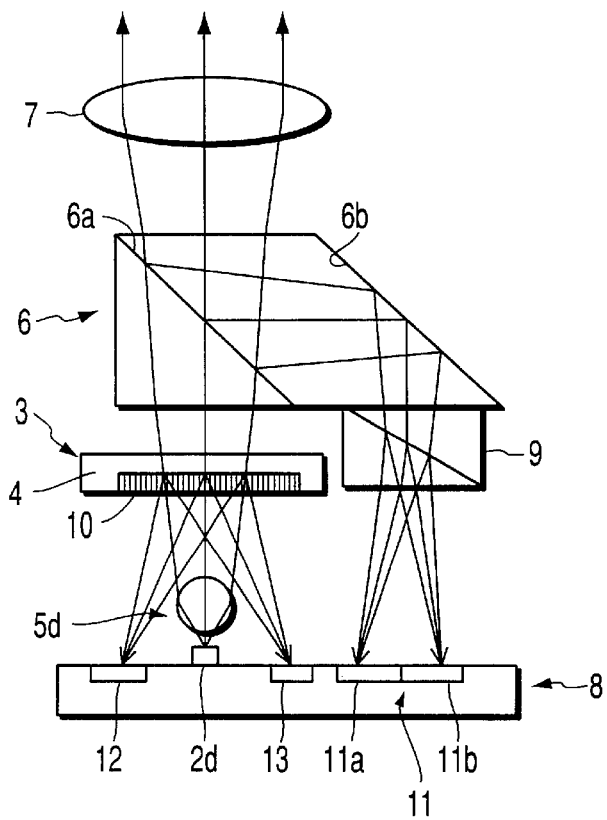
FIG. 8 is a schematic view illustrating part of an optical pickup apparatus according to a fifth embodiment of the invention.

FIG. 8 is a schematic view illustrating part of an optical pickup apparatus according to a fifth embodiment of the invention. The fifth embodiment differs from the first embodiment in that, in the former, a laser source 2d as a light source is provided on the silicon substrate 8, and an NA converting lens 5d used as an NA converter is interposed between the hologram element 3 and the laser source 2d. A laser beam output from the laser source 2d is subjected to NA conversion executed by the NA converting lens 5d, and then passes through the hologram element 3. Subsequently, part of the laser beam is guided to the magneto-optical disk 24, and part of the laser beam guided to the disk is returned as back-reflection. The back-reflection is branched by the hologram element 3 and directed to the light receiving element groups 12 and 13 without passing through the NA converting lens 5d.

As aforementioned, the laser beam emitted from the laser source 2d passes through the NA converting lens 5d. On the other hand, back-reflection returned from the data recording medium and branched by the hologram element 3 does not pass through the NA converting lens 5d. In this case, the light emission surface of the laser source 2d and the light receiving surfaces of the light receiving element groups 12 and 13 are arranged to have a conjugate positional relationship. To realize this relationship, the NA converting lens 5d is located near the laser source 2d and formed of a ball lens or a small convex lens. The light emission surface of the laser source 2d is provided on the silicon substrate 8 at a higher level than the light receiving surfaces of the light receiving element groups 12 and 13.

(Advantages)

Since the light emission surface of the laser source 2d is at a higher level than the light receiving surfaces of the light receiving element groups 12 and 13, the laser source 2d can be placed on the silicon substrate 8 with, for example, a sub mount interposed therebetween. Accordingly, it is not necessary to employ a complicated structure and process, in which the silicon substrate 8 is etched to form a mirror and a semiconductor laser chip is provided therein. Moreover, the number of manners that can be used to mount the laser source 2d increases.

Figure 9:
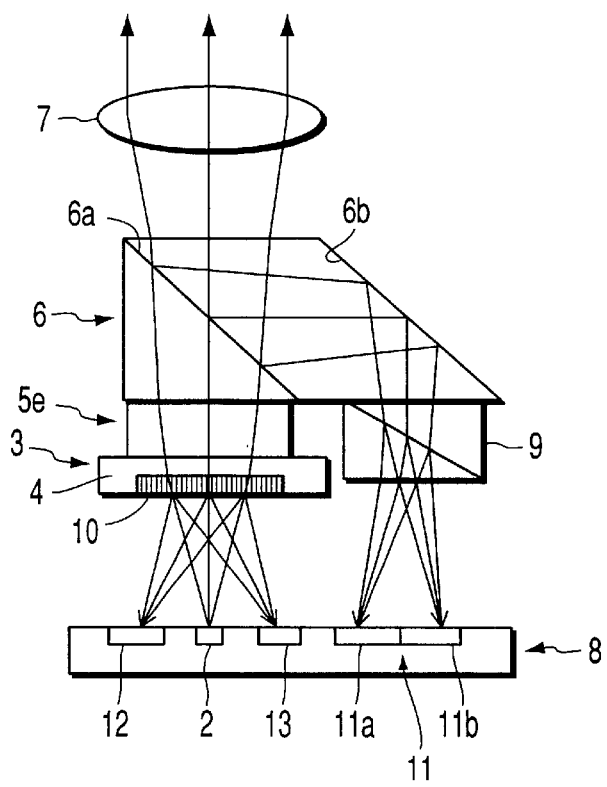
FIG. 9 is a schematic view illustrating part of an optical pickup apparatus according to a sixth embodiment of the invention.

FIG. 9 is a schematic view illustrating part of an optical pickup apparatus according to a sixth embodiment of the invention. The sixth embodiment differs from the first embodiment in that, in the former, an NA converting medium 5e is used as the NA converter and is formed integral with the hologram element 3 and the polarization beam splitter 6. The NA converting medium 5e is formed a flat medium having inhomogeneous index distribution, which perform as a lens.

(Advantages)

Since the NA converting medium 5e is formed of a flat medium performing as a lens, it can be attached to the hologram element 3 and the polarization beam splitter 6, without using a mirror frame or another support member. Accordingly, the number of component parts can be further reduced and hence the entire optical pickup apparatus can be made more compact.

FIG. 10 is a schematic view illustrating part of an optical pickup apparatus according to a seventh embodiment of the invention. The seventh embodiment differs from the first embodiment in that, in the former, a hologram element 3f includes a translucent plate 4f, a grating 10f located below the translucent plate 4f, and an NA converting hologram 5f located above the translucent plate 4f and formed of a grating. The translucent plate 4f, the grating 10f and the NA converting hologram 5f are formed integral. The hologram element 3f serves as a second beam branching unit and an NA converter. A laser beam emitted from the laser source 2 passes through the grating 10f of the hologram element 3f, and then is subjected to NA conversion executed by the NA converting hologram 5f. Subsequently, part of the laser beam is guided to the magneto-optical disk 24, and part of the laser beam guided to the disk is returned as back-reflection. The back-reflection is subjected to NA conversion executed by the NA hologram 5f, and then branched by the grating 10f. The branched beams enter the respective light receiving element groups 12 and 13.

(Advantages)

Since the translucent plate 4f, the grating 10f and the NA converting hologram 5f are formed integral, the number of component parts can be reduced, and hence the entire apparatus can be made compact. However, when using a hologram for NA conversion, it is necessary to sufficiently consider, for example, a change in the characteristics of the hologram due to its machining accuracy, an optical loss or a change in wavelength.

FIG. 11 is a schematic view illustrating part of an optical pickup apparatus according to an eighth embodiment of the invention. The eighth embodiment differs from the first embodiment in that, in the former, a hologram element 3g includes a translucent plate 4g, a grating 10g located above the translucent plate 4g, and an NA converting hologram 5g located below the translucent plate 4g and formed of a grating. The translucent plate 4g, the grating 10g and the NA converting hologram 5g are formed integral. The hologram element 3g serves as a second beam branching unit and an NA converter. A laser beam emitted from a laser source 2g is subjected to NA conversion executed by the NA converting hologram 5g, and then passed through the grating 10g of the hologram element 3g. Subsequently, part of the laser beam is guided to the magneto-optical disk 24, and part of the laser beam guided to the disk is returned as back-reflection. The back-reflection is branched by the grating 10g and directed to the light receiving element groups 12 and 13, without passing through the NA converting hologram 5g.

As aforementioned, the laser beam emitted from the laser source 2g passes through the NA converting hologram 5g. On the other hand, a laser beam reflected from the magneto-optical disk 24 and branched by the grating 10g does not pass through the NA converting hologram 5g. In this case, the light emission surface of the laser source 2g and the light receiving surfaces of the light receiving element groups 12 and 13 are arranged to have a conjugate positional relationship. To realize this relationship, the hologram element 3g is constructed such that the NA converting hologram 5g is located near the laser source 2g and formed of a small grating. The light emission surface of the laser source 2g is provided on the silicon substrate 8 at a higher level than the light receiving surfaces of the light receiving element groups 12 and 13.

(Advantages)

Since the light emission surface of the laser source 2g is at a higher level than the light receiving surfaces of the light receiving element groups 12 and 13, the laser source 2g can be placed on the silicon substrate 8 with, for example, a sub mount interposed therebetween. Accordingly, it is not necessary to employ a complicated structure and process, in which the silicon substrate 8 is etched to form a mirror and a semiconductor laser chip is provided therein. Moreover, the number of manners that can be used to mount the laser source 2g increases.

Figure 12:
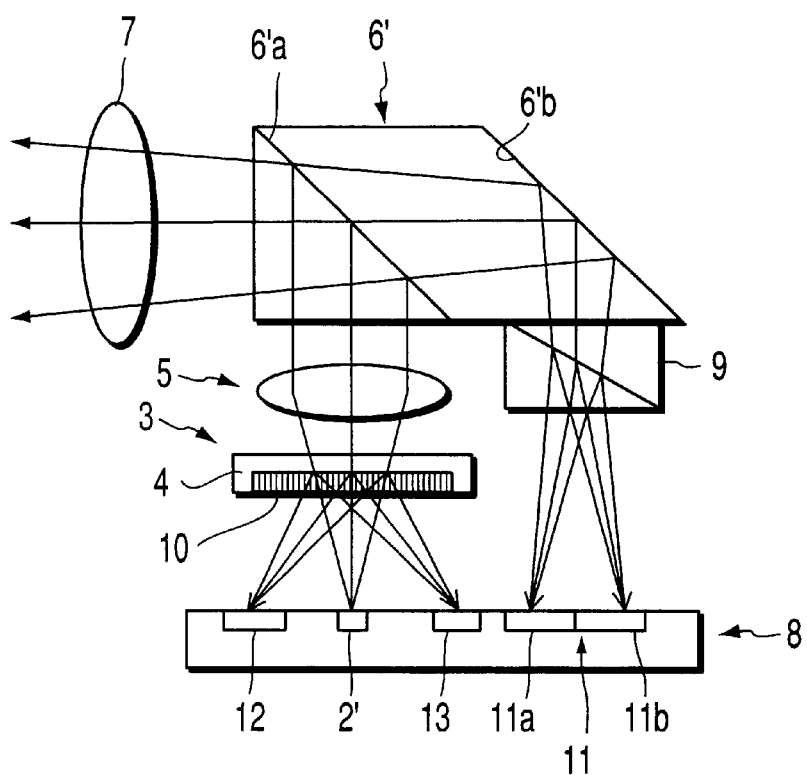
FIG. 12 is a schematic view illustrating a first modification of the optical pickup apparatus shown in FIG. 1.

FIG. 12 is a schematic view illustrating a first modification of the first embodiment shown in FIG. 1. In the first embodiment, the collimator lens 7 is located above the polarization beam splitter 6. On the other hand, in this embodiment, the collimator lens 7 is located beside a polarization beam splitter 6' used as a first beam branching unit. The polarization beam splitter 6' includes a polarizing film 6'a for separating a laser beam entering the splitter into polarized light beams, and a reflection surface 6'b for reflecting a laser beam output from the polarizing film 6'a.

A laser beam emitted from the laser source 2 enters the polarization beam splitter 6'. Part of the laser beam is reflected and deflected by the polarizing film 6' to the collimator lens 7. After that, the laser beam is guided to the data recording medium, partially reflected therefrom, again passed through the collimator lens 7, and again guided to the polarization beam splitter 6'. A part of the laser beam again entering the polarization beam splitter 6', which passes through the polarizing film 6'a, reflects from the reflection surface 6'b and enters the light receiving element group 11. On the other hand, another part of the laser beam entering the polarization beam splitter 6', which reflects from the polarizing film 6'a, enters the light receiving element groups 12 and 13.

The above-described structure increases the degree of freedom in designing the optical system. Moreover, if the light source, the NA converter and/or the second beam branching unit employed in this embodiment are modified appropriately, the embodiment can provide similar advantages to those obtained in the second–eighth embodiments.

Figure 13:
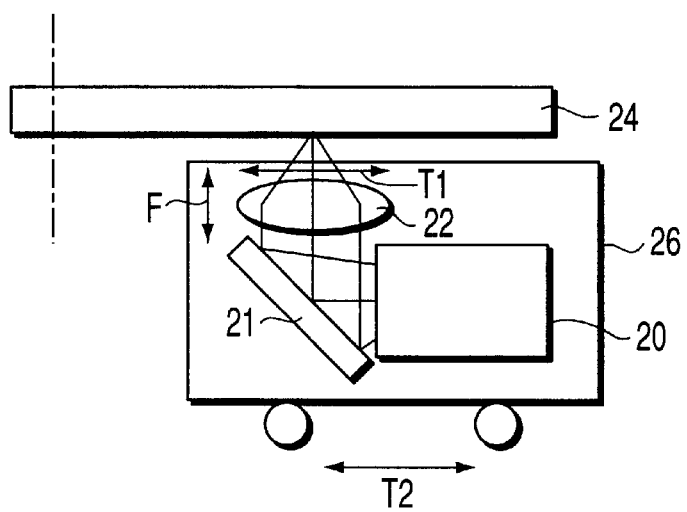
FIG. 13 is a schematic view illustrating a second modification of the optical pickup apparatus shown in FIG. 4.
Figure 14:
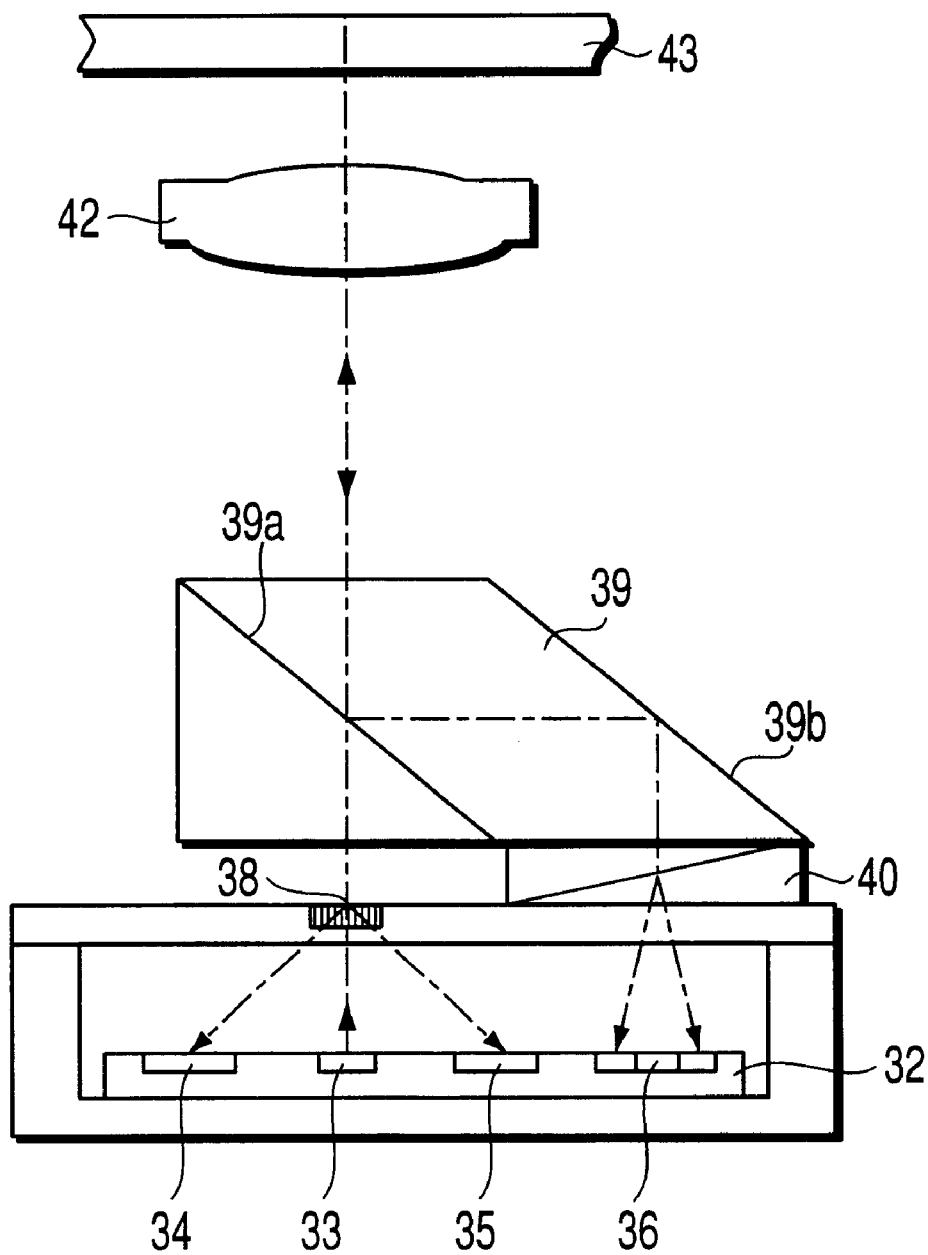
FIG. 14 is a schematic view illustrating a conventional optical pickup apparatus.

Referring now to FIG. 13, a second modification of the optical pickup apparatus 1 shown in FIG. 4 will be described. In this modification, similar elements to those employed in the optical pickup apparatus 1 of FIG. 4 are denoted by corresponding reference numerals, and no detailed description will be given thereof.

The structure, function and advantage of a section 20 in the modification are similar to those of the section 20 shown in FIG. 4. In this embodiment, the section 20 and a mirror 21, which is located in a direction in which the laser beam is propagated from the section 20, are formed integral as one body in a housing 26. In the housing 26, an objective 22 is provided between the mirror 21 and the magneto-optical disk 24. A laser beam passing through the objective 22 is converged onto the magneto-optical disk 24. The objective 22 can be shifted to the direction of an arrow F along the optical axis of the structure for focusing control and shifted to the direction of an arrow T1 perpendicular to the arrow F for tracking control. The housing 26 can be shifted to the direction of an arrow T2 along the surface of the magneto-optical disk 24 for, for example, access control.

The optical pickup apparatus 1 shown in FIG. 4 is an infinite optical system, while the modification shown in FIG. 13 is a finite optical system. In the optical pickup apparatus 1 shown in FIG. 4, a laser beam propagated between the collimator lens 7 and the objective 22 is a parallel beam, while in the modification of FIG. 13, a non-parallel beam passes between the section 20 and the objective 22.

Unlike the optical pickup apparatus 1 of FIG. 4, all the section 20, the mirror 21 and the objective 22 are contained in the housing 26 in the modification of FIG. 13. Accordingly, the apparatus of this modification can be made more compact than that of FIG. 4.

Although the first embodiment employs a spherical convex lens as the NA converter, the optical performance of the NA converter can be enhanced if it is formed of an aspheric lens or a plurality of lenses combined. However, in order to reduce the cost or the size of the apparatus, it is desirable that a spherical lens or a single lens should be used. In addition, if the elliptic profile of the laser beam is converted into substantially a circular one by using a plurality of cylindrical lenses or toric lenses to form an NA converter, the laser beam can be used more effectively. Also, since it is not necessary to use any special beam shaping prism, the apparatus can be made more compact at a lower cost.

In the optical pickup apparatus 1 of FIG. 4, each of the collimator lens and the objective can be formed of a spheric lens, an aspheric lens, or a plurality of lenses including spheric and/or aspheric lenses.

Although the above-described embodiments employ a Wollaston prism as the second beam branching unit, anisotropic optical crystal or a polarization beam splitter prism may be used instead of the Wollaston prism.

In the embodiments, the light receiving element groups 12 and 13 are provided in a single semiconductor substrate 8 made of, for example, silicon. However, it is a matter of course that similar functions and advantages can be obtained even if a plurality of substrates are used for the purpose of, for example, securing properties required for the light receiving element groups. Furthermore, although the above embodiments are directed to pickup apparatuses for magneto-optical disks, these apparatuses are also applicable to an optical disk, such as a ROM or a phase change recorder, for reproducing a signal on the basis of the amount of reflected light.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical pickup apparatus for executing at least one of data recording and reproduction by applying a laser beam to a data recording medium, comprising:

a semiconductor substrate having a main surface;

a light source for emitting a laser beam in a direction substantially perpendicular to the main surface of the semiconductor substrate;

an NA converter for receiving the laser beam emitted from the light source and for outputting the laser beam so that a divergent angle of the outputted laser beam is smaller than a divergent angle of the received laser beam, wherein the NA converter has a numerical aperture between 0.15 and 0.25 on a side of the light source;

an objective opposed to the data recording medium;

a first beam branching unit for permitting one of transmission therethrough and reflection therefrom of the laser beam outputted from the NA converter to thereby guide the laser beam to the data recording medium via the objective so that the laser beam reflects from the data recording medium, wherein the first beam branching unit also transmits therethrough and reflects therefrom a part of and another part of the laser beam reflecting from the data recording medium and then passing through the objective, respectively, thereby branching the laser beam in two directions; and a first light receiving element provided at the semiconductor substrate for receiving the laser beam branched by the first beam branching unit.

2. The optical pickup apparatus according to claim 1, wherein the first beam branching unit transmits therethrough the laser beam outputted from the NA converter to thereby guide the laser beam to the data recording medium via the objective.

3. The optical pickup apparatus according to claim 1, further comprising:

a second beam branching unit provided between the light source and the first beam branching unit for transmitting therethrough, in one direction, a part of the laser beam reflecting from the data recording medium and passing through the objective, and for branching therefrom, in another direction, another part of the laser beam reflecting from the data recording medium and passing through the objective; and a second light receiving element for receiving the laser beam branched by the second beam branching unit.

4. The optical pickup apparatus according to claim 3, wherein the second beam branching unit is provided between the light source and the NA converter.

5. The optical pickup apparatus according to claim 3, wherein the NA converter is provided between the second beam branching unit and the light source.

6. The optical pickup apparatus according to claim 5, wherein the NA converter is provided between the second beam branching unit and the second light receiving element, so that the laser beam branched by the second beam branching unit passes through the NA converter and reaches the second light receiving element.

7. The optical pickup apparatus according to claim 5, wherein the NA converter is provided between the second beam branching unit and the second light receiving element, so that the laser beam branched by the second beam branching unit reaches the second light receiving element without passing through the NA converter.

8. The optical pickup apparatus according to claim 3, wherein the second light receiving element is provided at the semiconductor substrate.

9. The optical pickup apparatus according to claim 3, wherein the second beam branching unit includes a hologram element.

10. The optical pickup apparatus according to claim 3, wherein at least, the semiconductor substrate, the light source, the first beam branching unit, the second beam branching unit and the NA converter are integrated as one body.

11. The optical pickup apparatus according to claim 3, wherein the NA converter is integral with at least one of the first beam branching unit and the second beam branching unit.

12. The optical pickup apparatus according to claim 1, further comprising a collimator lens provided between the first beam branching unit and the objective, so that the collimator lens converts the laser beam outputted from first beam branching unit into substantially a parallel laser beam.

13. The optical pickup apparatus according to claim 12, wherein the collimator lens corrects spherical aberration that occurs in the NA converter, the first beam branching unit and the second beam branching unit.

14. The optical pickup apparatus according to claim 1, further comprising a polarization beam separating unit for separating, into a plurality of polarized laser beams, the laser beam reflecting from the data recording medium, passing through the objective and branched by the first beam branching unit, the polarized laser beams being received by the first light receiving element.

15. The optical pickup apparatus according to claim 14, wherein the polarized laser beams are focused on a surface of the first light receiving element.

16. The optical pickup apparatus according to claim 1, wherein the first beam branching unit includes a polarization beam splitter having a transmittance and a reflectance that vary in accordance with a polarization of light entering the polarization beam splitter.

17. The optical pickup apparatus according to claim 1, wherein the NA converter includes a convex lens having two opposite surfaces, one of said two opposite surfaces including a convex surface, and the other including a flat surface.

18. An optical pickup apparatus for executing at least one of data recording and reproduction by applying a laser beam to a data recording medium, comprising:

a semiconductor substrate having a main surface;

a light source for emitting a laser beam in a direction substantially perpendicular to the main surface of the semiconductor substrate;

divergent angle converting means for receiving the laser beam emitted from the light source, converting the received laser beam, and outputting the laser beam so that a divergent angle of the outputted laser beam is smaller than a divergent angle of the received laser beam, wherein the divergent angle converting means has a numerical aperture between 0.15 and 0.25 on a side of the light source;

an objective opposed to the data recording medium;

beam branching means for permitting one of transmission therethrough and reflection therefrom of the laser beam outputted from the divergent angle converting means to thereby guide the laser beam to the data recording medium via the objective so that the laser beam reflects from the data recording medium, and for transmitting therethrough and reflecting therefrom a part of and another part of the laser beam reflecting from the data recording medium and then passing through the objective, respectively, thereby branching the laser beam in two directions; and receiving means provided at the semiconductor substrate for receiving the laser beam branched by the beam branching means.

* * * * *